US012665788B2

(12) United States Patent
Mestav

(10) Patent No.: US 12,665,788 B2
(45) Date of Patent: Jun. 23, 2026

(54) CSI COMPRESSION AND DECOMPRESSION

(71) Applicant: Nokia Technologies Oy, Espoo (FI)

(72) Inventor: Kursat Mestav, Gloucester, VA (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 18/787,159

(22) Filed: Jul. 29, 2024

(65) Prior Publication Data

US 2025/0047524 A1     Feb. 6, 2025

Related U.S. Application Data

(60) Provisional application No. 63/517,061, filed on Aug. 1, 2023.

(51) Int. Cl.
*H03M 7/30*          (2006.01)
*H04L 25/02*         (2006.01)

(52) U.S. Cl.
CPC .......... *H04L 25/0204* (2013.01); *H03M 7/30* (2013.01)

(58) Field of Classification Search
CPC ............................ H04L 25/0204; H03M 7/30
See application file for complete search history.

(56) References Cited

U.S. PATENT DOCUMENTS

2021/0281491 A1*   9/2021  Yelahanka Raghuprasad ............ H04L 41/5019

* cited by examiner

*Primary Examiner* — Rahel Guarino
(74) *Attorney, Agent, or Firm* — Barta Jones, PLLC

(57)          ABSTRACT

A method comprising: generating, at a terminal device, channel state information for a channel between the terminal device and a network device; generate compressed channel state information based on the channel state information by using a compression model; and transmit, to the network device, the compressed channel state information and an identification of the compression model.

20 Claims, 9 Drawing Sheets

1300

CSI COMPRESSION AND DECOMPRESSION

FIELDS

Various example embodiments of the present disclosure generally relate to the field of telecommunication and in particular, to methods, apparatuses and computer readable storage medium for channel state information (CSI) compression and decompression.

BACKGROUND

Several technologies have been proposed to improve communication performances. For example, communication devices may employ an artificial intelligence/machine learning (AI/ML) model to improve communication qualities. The AI/ML model can be applied to different scenarios, for example, for reporting CSI. To this end, a terminal device may compress CSI by using an AI/ML model and a network device may reconstruct the CSI by using another AI/ML model.

SUMMARY

In a first aspect of the present disclosure, there is provided an apparatus. The apparatus comprises at least one processor; and at least one memory storing instructions that, when executed by the at least one processor, cause the apparatus at least to: generate channel state information for a channel between the apparatus and a network device; generate compressed channel state information based on the channel state information by using a compression model; and transmit, to the network device, the compressed channel state information and an identification of the compression model.

In a second aspect of the present disclosure, there is provided an apparatus. The apparatus comprises at least one processor; and at least one memory storing instructions that, when executed by the at least one processor, cause the apparatus at least to: receive, from a terminal device, compressed channel state information for a channel between the terminal device and the apparatus, and an identification of a compression model for generating the compressed channel state information; determine an indicator corresponding to the compression model based on the identification; and reconstruct, by using a decompression model, channel state information for the channel based on the compressed channel state information and the indicator.

In a third aspect of the present disclosure, there is provided an apparatus. The apparatus comprises at least one processor; and at least one memory storing instructions that, when executed by the at least one processor, cause the apparatus at least to: generate channel state information for a channel between the apparatus and a network device; generate, by using a compression model, compressed channel state information based on the channel state information and an indicator corresponding to a decompression model for reconstructing the channel state information; and transmit the compressed channel state information to the network device.

In a fourth aspect of the present disclosure, there is provided an apparatus. The apparatus comprises at least one processor; and at least one memory storing instructions that, when executed by the at least one processor, cause the apparatus at least to: receive, from a terminal device, compressed channel state information for a channel between the terminal device and the apparatus; and reconstruct, by using a decompression model, channel state information for the channel based on the compressed channel state information, and wherein the compressed channel state information is generated based on the channel state information and an indicator corresponding to the decompression model.

In a fifth aspect of the present disclosure, there is provided a method. The method comprises: generating, at a terminal device, channel state information for a channel between the terminal device and a network device; generating compressed channel state information based on the channel state information by using a compression model; and transmitting, to the network device, the compressed channel state information and an identification of the compression model.

In a sixth aspect of the present disclosure, there is provided a method. The method comprises: receiving, at a network device from a terminal device, compressed channel state information for a channel between the terminal device and the network device, and an identification of a compression model for generating the compressed channel state information; determining an indicator corresponding to the compression model based on the identification; and reconstructing, by using a decompression model, channel state information for the channel based on the compressed channel state information and the indicator.

In a seventh aspect of the present disclosure, there is provided a method. The method comprises: generating, at a terminal device, channel state information for a channel between the terminal device and a network device; generating, by using a compression model, compressed channel state information based on the channel state information and an indicator corresponding to a decompression model for reconstructing the channel state information; and transmitting the compressed channel state information to the network device.

In an eighth aspect of the present disclosure, there is provided a method. The method comprises: receiving, at a network device from a terminal device, compressed channel state information for a channel between the terminal device and the network device; and reconstructing, by using a decompression model, channel state information for the channel based on the compressed channel state information, and wherein the compressed channel state information is generated based on the channel state information and an indicator corresponding to the decompression model.

In a ninth aspect of the present disclosure, there is provided an apparatus. The apparatus comprises means for generating channel state information for a channel between the apparatus and a network device; means for generating compressed channel state information based on the channel state information by using a compression model; and means for transmitting, to the network device, the compressed channel state information and an identification of the compression model.

In a tenth aspect of the present disclosure, there is provided an apparatus. The apparatus comprises means for receiving, from a terminal device, compressed channel state information for a channel between the terminal device and the apparatus, and an identification of a compression model for generating the compressed channel state information; means for determining an indicator corresponding to the compression model based on the identification; and means for reconstructing, by using a decompression model, channel state information for the channel based on the compressed channel state information and the indicator.

In an eleventh aspect of the present disclosure, there is provided an apparatus. The apparatus comprises means for generating channel state information for a channel between the apparatus and a network device; means for generating, by using a compression model, compressed channel state information based on the channel state information and an indicator corresponding to a decompression model for reconstructing the channel state information; and means for transmitting the compressed channel state information to the network device.

In a twelfth aspect of the present disclosure, there is provided an apparatus. The apparatus comprises means for receiving, from a terminal device, compressed channel state information for a channel between the terminal device and the apparatus; and means for reconstructing, by using a decompression model, channel state information for the channel based on the compressed channel state information, and wherein the compressed channel state information is generated based on the channel state information and an indicator corresponding to the decompression model.

In a thirteenth aspect of the present disclosure, there is provided a computer readable medium. The computer readable medium comprises instructions stored thereon for causing an apparatus to perform at least the method according to the fifth aspect.

In a fourteenth aspect of the present disclosure, there is provided a computer readable medium. The computer readable medium comprises instructions stored thereon for causing an apparatus to perform at least the method according to the sixth aspect.

In a fifteenth aspect of the present disclosure, there is provided a computer readable medium. The computer readable medium comprises instructions stored thereon for causing an apparatus to perform at least the method according to the seventh aspect.

In a sixteenth aspect of the present disclosure, there is provided a computer readable medium. The computer readable medium comprises instructions stored thereon for causing an apparatus to perform at least the method according to the eighth aspect.

It is to be understood that the Summary section is not intended to identify key or essential features of embodiments of the present disclosure, nor is it intended to be used to limit the scope of the present disclosure. Other features of the present disclosure will become easily comprehensible through the following description.

BRIEF DESCRIPTION OF THE DRAWINGS

Some example embodiments will now be described with reference to the accompanying drawings, where.

Throughout the drawings, the same or similar reference numerals represent the same or similar element.

DETAILED DESCRIPTION

Figure 1:
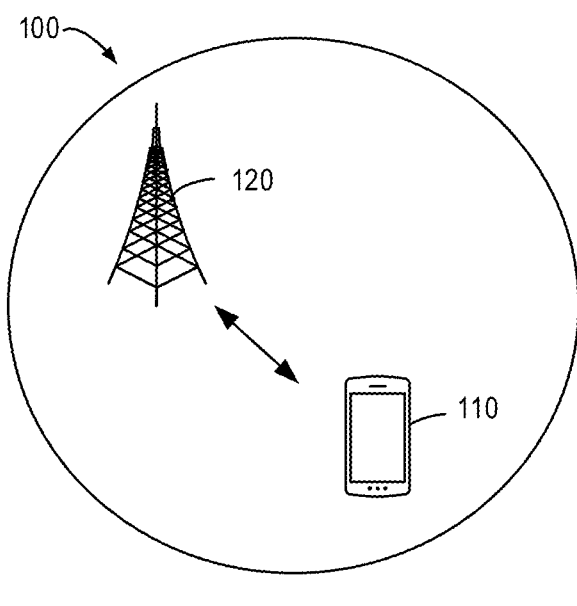
FIG. 1 illustrates an example communication environment in which example embodiments of the present disclosure can be implemented.

Principle of the present disclosure will now be described with reference to some example embodiments. It is to be understood that these embodiments are described only for the purpose of illustration and help those skilled in the art to understand and implement the present disclosure, without suggesting any limitation as to the scope of the disclosure. Embodiments described herein can be implemented in various manners other than the ones described below.

In the following description and claims, unless defined otherwise, all technical and scientific terms used herein have the same meaning as commonly understood by one of ordinary skills in the art to which this disclosure belongs.

References in the present disclosure to "one embodiment," "an embodiment," "an example embodiment," and the like indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It shall be understood that although the terms "first," "second," . . . , etc. in front of noun(s) and the like may be used herein to describe various elements, these elements should not be limited by these terms. These terms are only used to distinguish one element from another and they do not limit the order of the noun(s). For example, a first element could be termed a second element, and similarly, a second element could be termed a first element, without departing from the scope of example embodiments. As used herein, the term "and/or" includes any and all combinations of one or more of the listed terms.

As used herein, "at least one of the following: <a list of two or more elements>" and "at least one of <a list of two or more elements>" and similar wording, where the list of two or more elements are joined by "and" or "or", mean at least any one of the elements, or at least any two or more of the elements, or at least all the elements.

As used herein, unless stated explicitly, performing a step "in response to A" does not indicate that the step is performed immediately after "A" occurs and one or more intervening steps may be included.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof.

As used in this application, the term "circuitry" may refer to one or more or all of the following:

(a) hardware-only circuit implementations (such as implementations in only analog and/or digital circuitry) and (b) combinations of hardware circuits and software, such as (as applicable):

(i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions) and (c) hardware circuit(s) and or processor(s), such as a microprocessor(s) or a portion of a microprocessor(s), that requires software (e.g., firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

As used herein, the term "communication network" refers to a network following any suitable communication standards, such as New Radio (NR), Long Term Evolution (LTE), LTE-Advanced (LTE-A), Wideband Code Division Multiple Access (WCDMA), High-Speed Packet Access (HSPA), Narrow Band Internet of Things (NB-IoT) and so on. Furthermore, the communications between a terminal device and a network device in the communication network may be performed according to any suitable generation communication protocols, including, but not limited to, the first generation (1G), the second generation (2G), 2.5G, 2.75G, the third generation (3G), the fourth generation (4G), 4.5G, the fifth generation (5G), the sixth generation (6G) communication protocols, and/or any other protocols either currently known or to be developed in the future. Embodiments of the present disclosure may be applied in various communication systems. Given the rapid development in communications, there will of course also be future type communication technologies and systems with which the present disclosure may be embodied. It should not be seen as limiting the scope of the present disclosure to only the aforementioned system.

As used herein, the term "network device" refers to a node in a communication network via which a terminal device accesses the network and receives services therefrom. The network device may refer to a base station (BS) or an access point (AP), for example, a node B (NodeB or NB), an evolved NodeB (eNodeB or eNB), an NR NB (also referred to as a gNB), a Remote Radio Unit (RRU), a radio header (RH), a remote radio head (RRH), a relay, an Integrated Access and Backhaul (IAB) node, a low power node such as a femto, a pico, a non-terrestrial network (NTN) or non-ground network device such as a satellite network device, a low earth orbit (LEO) satellite and a geosynchronous earth orbit (GEO) satellite, an aircraft network device, and so forth, depending on the applied terminology and technology. In some example embodiments, radio access network (RAN) split architecture comprises a Centralized Unit (CU) and a Distributed Unit (DU) at an IAB donor node. An IAB node comprises a Mobile Terminal (IAB-MT) part that behaves like a UE toward the parent node, and a DU part of an IAB node behaves like a base station toward the next-hop IAB node.

The term "terminal device" refers to any end device that may be capable of wireless communication. By way of example rather than limitation, a terminal device may also be referred to as a communication device, user equipment (UE), a Subscriber Station (SS), a Portable Subscriber Station, a Mobile Station (MS), or an Access Terminal (AT). The terminal device may include, but not limited to, a mobile phone, a cellular phone, a smart phone, voice over IP (VOIP) phones, wireless local loop phones, a tablet, a wearable terminal device, a personal digital assistant (PDA), portable computers, desktop computer, image capture terminal devices such as digital cameras, gaming terminal devices, music storage and playback appliances, vehicle-mounted wireless terminal devices, wireless endpoints, mobile stations, laptop-embedded equipment (LEE), laptop-mounted equipment (LME), USB dongles, smart devices, wireless customer-premises equipment (CPE), an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. The terminal device may also correspond to a Mobile Termination (MT) part of an IAB node (e.g., a relay node). In the following description, the terms "terminal device", "communication device", "terminal", "user equipment" and "UE" may be used interchangeably.

As used herein, the term "resource," "transmission resource," "resource block," "physical resource block" (PRB), "uplink resource," or "downlink resource" may refer to any resource for performing a communication, for example, a communication between a terminal device and a network device, such as a resource in time domain, a resource in frequency domain, a resource in space domain, a resource in code domain, or any other combination of the time, frequency, space and/or code domain resource enabling a communication, and the like. In the following, unless explicitly stated, a resource in both frequency domain and time domain will be used as an example of a transmission resource for describing some example embodiments of the present disclosure. It is noted that example embodiments of the present disclosure are equally applicable to other resources in other domains.

As used herein, the term "AI/ML model" may refer to a data driven algorithm that applies AI/ML techniques to generate a set of outputs based on a set of inputs. In the present disclosure, the term "AI/ML model" may be interchangeably with the terms "model", "AI model" and "ML model".

The term "two-sided AI/ML model", "2-sided model" or "2-sided ML model" or the like used herein may refer to a pair of AI/ML models over which joint inference is performed, where joint inference comprises AI/ML inference whose inference is performed jointly across the terminal device and the network device.

As used herein, unless indicating explicitly to the contrary, the term "compression model" may refer to a model for compressing CSI. Similarly, unless indicating explicitly to the contrary, the term "decompression model" may refer to a model for reconstructing CSI from compressed CSI.

FIG. 1 illustrates an example communication environment 100 in which example embodiments of the present disclosure can be implemented. In the communication environment 100, In the communication environment 100, a terminal device 110 and a network device 120 can communicate with each other. In some example embodiments, the terminal device 110, for example, may be a UE. The network device 120, for example, may be a gNB.

In some example embodiments, a link from the network device 120 to the terminal device 110 is referred to as a downlink (DL), while a link from the terminal device 110 to the network device 120 is referred to as an uplink (UL). In DL, the network device 120 is a transmitting (TX) device (or a transmitter) and the terminal device 110 is a receiving (RX) device (or a receiver). In UL, the terminal device 110 is a TX device (or a transmitter) and the network device 120 is a RX device (or a receiver).

Communications in the communication environment 100 may be implemented according to any proper communication protocol(s), comprising, but not limited to, cellular communication protocols of the first generation (1G), the second generation (2G), the third generation (3G), the fourth generation (4G), the fifth generation (5G), the sixth generation (6G), and the like, wireless local network communication protocols such as Institute for Electrical and Electronics Engineers (IEEE) 802.11 and the like, and/or any other protocols currently known or to be developed in the future. Moreover, the communication may utilize any proper wireless communication technology, comprising but not limited to: Code Division Multiple Access (CDMA), Frequency Division Multiple Access (FDMA), Time Division Multiple Access (TDMA), Frequency Division Duplex (FDD), Time Division Duplex (TDD), Multiple-Input Multiple-Output (MIMO), Orthogonal Frequency Division Multiple (OFDM), Discrete Fourier Transform spread OFDM (DFT-s-OFDM) and/or any other technologies currently known or to be developed in the future.

It is to be understood that the number of devices and their connections shown in FIG. 1 are only for the purpose of illustration without suggesting any limitation. The communication environment 100 may include any suitable number of devices configured to implement example embodiments of the present disclosure.

Figure 2:
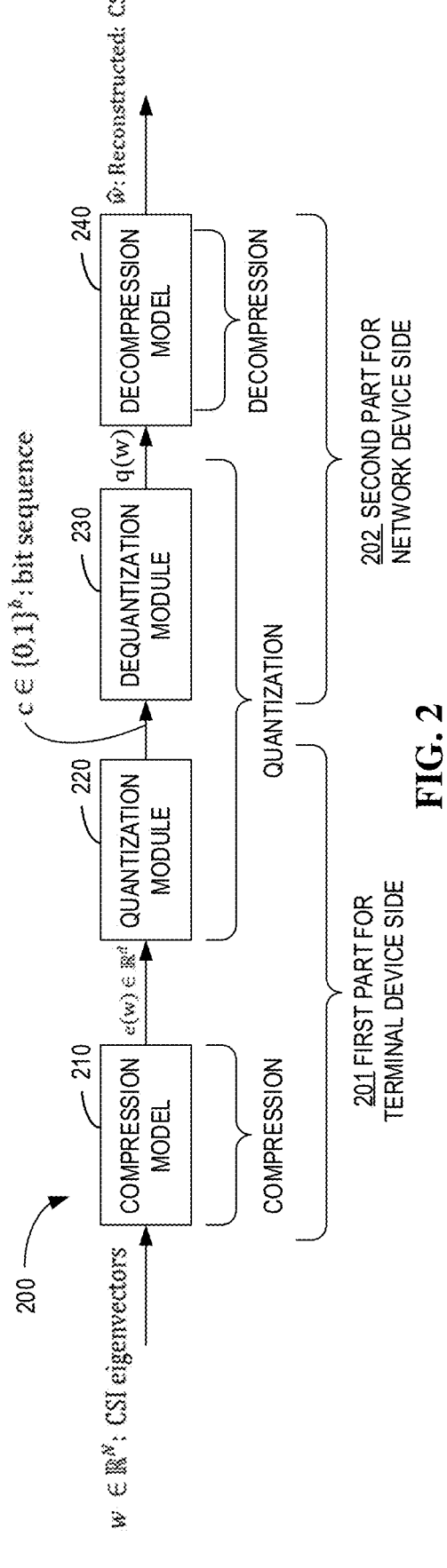
FIG. 2 illustrates an example architecture of a 2-sided ML model for CSI reporting according to some example embodiments of the present disclosure.

In the communication environment 100, the terminal device 110 may estimate a channel between the terminal device 110 and the network device 120, and report CSI to the network device 120. A 2-sided ML model may be used for CSI reporting. Reference is now made to FIG. 2 to illustrate an example architecture of a 2-sided ML model 200 for CSI reporting according to some example embodiments of the present disclosure.

In general, the 2-sided ML model 200 may include a first part 201 for the terminal device side (e.g., the UE side) and a second part 202 for the network device side (e.g., the gNB side). The CSI obtained by measuring a reference signal from the network device 120 for example may be represented by w as shown in FIG. 2. The channel values of CSI may include complex values but can be also represented by the real and imaginary values. Using the transformation, the CSI w with real numbers may represent the channel that has N elements.

The compression model deployed at the terminal device 110 may be an ML model and may compress the CSI w into compressed CSI, which may be denoted as a lower dimensional vector $e(w)$, $(d \ll N)$. To transmit the compressed CSI over the radio link, a quantization module 220, which is also referred to as a quantizer, may convert the compressed CSI into compressed bits, which may be denoted as c and may be also referred to as a bit sequence. For example, the quantization module 220 may perform binarization and map the reduced dimensional values $e(w)$ into a vector of compressed binary elements c that is represented by b bit values.

Then, the compressed bits c with b bit values may be transmitted from the terminal device 110 to the network device 120. At the network device side, a dequantization module 230, which is also referred to as a de-quantizer, may convert the compressed bits received from the terminal device 110 into a set of values, which may be denoted as $q(w)$. For example, the dequantization module 230 may perform de-binarization and obtain the set of values $q(w)$ from the binary vector c by using a codebook. Then, the decompression model 240 may generate the reconstructed CSI $\hat{w}$ based on the values $q(w)$. For example, the decompression model 240 may reconstruct the channel by mapping $q(w)$ to channel estimates $\hat{w}$.

The compression model 210 and decompression model 240 may be both parametrized machine learning models such as neural networks. The compression model 210 may be implemented as an encoder and the decompression model 240 may be implemented as a decoder accordingly. In the present disclosure, the terms "compression model" and "encoder" may be used interchangeably, and the terms "decompression model" and "decoder" may be used interchangeably.

It is to be understood that the architecture as shown in FIG. 2 is an example, without any limitation. In FIG. 2, the compression model 210 and the quantization module 220 are shown separately, and the decompression model 240 and the dequantization module 230 are shown separately. However, this is merely for purpose of illustration without any limitation. In some example embodiments, the functions of the compression model 210 and the quantization module 220 as described above may be performed by a single model. Alternatively, or in addition, in some example embodiments, the functions of the decompression model 240 and the dequantization module 230 as described above may be performed by a single model. In the following, the compression model 210 (or the encoder) and optionally the quantization module 220 may be referred to as a CSI generation part. Accordingly, the decompression model 240 (or the decoder) and optionally the dequantization module 230 may be referred to as a CSI reconstruction part.

For the 2-sided ML model such as the one shown in FIG. 2, different training schemes may be employed. For example, if type III training of separate training of the encoder and decoder with the exchange of only datasets is followed, there are two training schemes can be used: the terminal device first training (also referred to as UE-first training) scheme and the network device-first training (also referred to as network-first training) scheme.

CSI compression using the 2-sided machine learning model (such as the model shown in FIG. 2) including an encoder at the terminal device side and a decoder at the network device side is shown to have superior performance to classical methods. However, training collaboration is needed to make independently trained compression model from the terminal device side and decompression model from the network device side work together.

Take the UE as an example of the terminal device and the gNB as an example of the network device. If the UE-first training approach is followed, after the training, different compression models may be obtained by different training entities. For example, UEs from different sources may use different compression models. The difference between these compression models may be caused by different model structures, different training datasets, different training strategies, different UE versions, different UE types, etc. In this situation, a gNB would have to train multiple decompression models to use with each of these compression models. In other words, the gNB would have to deploy a corresponding decompression model for each compression model. This would cause a burden of training and storing multiple network part models at the gNB to pair with different UE part models.

A similar problem would occur if the network-first training approach is followed. If the network-first training approach is followed, after the training, different decompression models may be obtained by different training entities. For example, gNBs from different sources may use different decompression models. The difference between these decompression models may be caused by different model structures, different training datasets, different training strategies, etc. In this situation, a UE would have to train and maintain multiple compression models to use with each of these decompression models. In other words, the UE would have to deploy a corresponding compression model for each decompression model. This would cause a burden of training and storing multiple UE part models at the UE to pair with different network part models.

The maintenance and storage of multiple models could be costly. The memory usage would be multiplied by the number of compression models for the gNB. The same problem would occur for the UE if different encoders were trained to match multiple decoders.

According to some example embodiments of the present disclosure, there is provided a solution for CSI compression and decompression. In some example embodiments, the terminal device-first training may be employed. A decompression model common for a plurality of compression models may be used and reconstruction of CSI by the decompression model may be aided by using an indicator corresponding to a compression model as an additional input to the decompression model. In this way, the requirement for training and maintaining multiple decompression models can be avoided for the network device, and the performance of the single decompression model at the network device can be improved.

In some example embodiments, the network device-first training may be employed. A compression model common for a plurality of decompression models may be used and compression of CSI by the compression model may be aided by using an indicator corresponding to a decompression model as an additional input to the compression model. In this way, the requirement for training and maintaining multiple compression models can be avoided for the terminal device, and the performance of the single compression model at the terminal device can be improved.

Example embodiments of the present disclosure will be described in detail below with reference to the accompanying drawings.

Terminal Device-First Training Scheme

In some example embodiments, the terminal device-first training scheme may be employed. Each training entity for a compression model may train an end-to-end model including the compression model, a quantization module, a dequantization module and a decompression model, such as the model 200 of FIG. 2. For example, each training entity at the UE side may train an end-to-end autoencoder that includes an encoder, a quantizer, a de-quantizer and a decoder. As a result, a plurality of compression models may be trained by different training entities at the terminal device side.

In the following, for purpose of discussion without any limitation, it is assumed that Q compression models may be trained by Q training entities. After training the end-to-end model, at least a portion of a training dataset for training each of the Q compression models may be shared to a training entity for the decompression model. Training samples $\{w_i, q_i(w)\}$ for training the i-th compression model by the i-th training entity may be shared with the training entity for the decompression model, where i=1, 2, . . . , Q.

Figure 3:
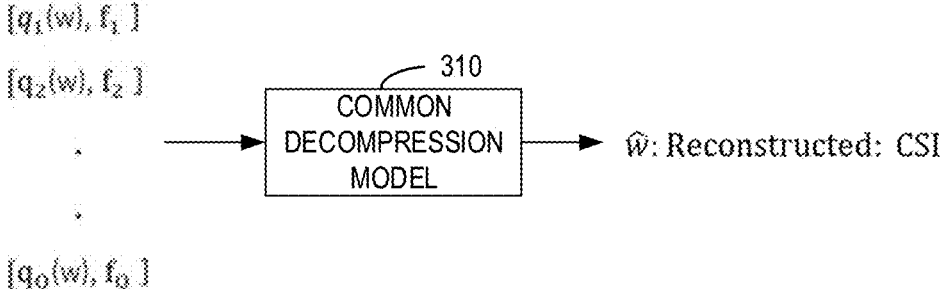
FIG. 3 illustrates an example for training of a decompression model common for a plurality of compression models according to some example embodiments of the present disclosure.

Then, the decompression model common for the plurality of compressions models may be trained based on the training samples $\{w_i, q_i(w)\}$. Reference is now made to FIG. 3 to illustrate an example for training of a common decompression model 310 for Q compression models according to some example embodiments of the present disclosure. In training of the common decompression model 310, the latent vector $q_i(w)$ of each training sample is used as an input to the common decompression model 310 and the CSI $w_i$ without compression may be used as the ground truth.

In addition, an indicator (for example, a flag) corresponding to each compression model may be used as an additional input to the common decompression model 310. In other words, the training samples $\{w_i, q_i(w)\}$ for the i-th compression model may be used to train the common decompression model 310 in combination with the indicator corresponding to the i-th compression model. For example, as shown in FIG. 3, a flag $f_i$ for the latent vector $q_i(w)$ is input to the common decompression model 310 along with the latent vector $q_i(w)$.

In such example embodiments, since the input to the common decompression model 310 is a quantized latent vector, the indicator (for example, the flag $f_i$) corresponding to the i-th compression model may be one or more elements added to the latent vector $q_i(w)$. For example, an element may be added to the latent vector $q_i(w)$ to indicate which type of terminal device the latent vector $q_i(w)$ is from.

Figure 4:
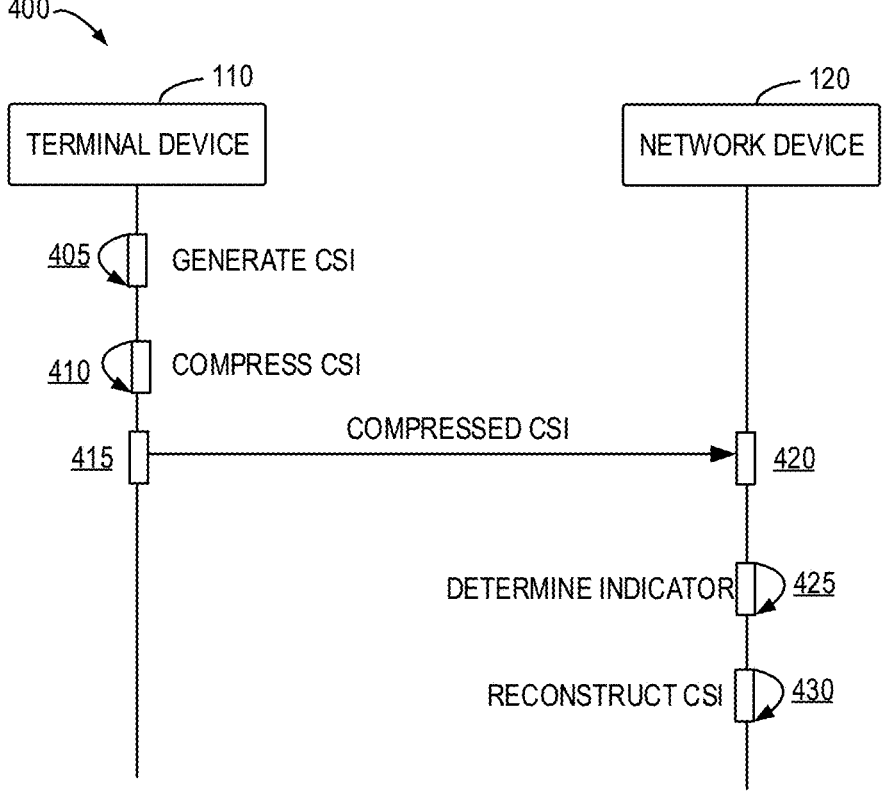
FIG. 4 illustrates an example signaling flow of reporting CSI in the case of first training at the terminal device side according to some example embodiments of the present disclosure.

In some example embodiments, the training of the ML models may be performed offline. After training, the Q compression models and the common decompression model 310 may be used for real time operations. Reference is now made to FIG. 4 to illustrate an example signaling flow 400 of reporting CSI in the case of terminal device-first training according to some example embodiments of the present disclosure. The signaling flow 400 involves the terminal device 110 and the network device 120.

The terminal device 110 may generate (405) CSI for a channel between the terminal device 110 and the network device 120. In other words, channel estimation may be performed by the terminal device 110. For example, the terminal device 110 may estimate the channel based on reference signals from the network device 110 and construct the CSI w.

Then, the terminal device 110 may generate (410) compressed CSI based on the CSI generated at 405 by using a compression model. For example, the estimated CSI w may be input to the compression model to generate the compressed CSI e(w).

The terminal device 110 may transmit (415), to the network device 120, the compressed CSI and an identification of the compression model used by the terminal device 110. For example, a combined message including both the compressed CSI and the identification may be transmitted to the network device 120. The identification may be included as part of a CSI report. Since the network device 120 may maintain a decompression model common for a plurality of compression models, the terminal device 110 may indicate the network device 120 of which compression model is used such that the common decompression model of the network device 120 reconstruct the CSI with an improved performance.

The identification of the compression model may include any suitable information which can identify which compression model is used by the terminal device 110 to compress CSI. In some example embodiments, the identification of the compression model may be based on or related to a type of the compression model. The type of the compression model may correspond to any suitable characteristic of the compression model, for example but not limited to, a machine learning algorithm employed by the compression model, a neural network structure of the compression model, a training dataset used for training the compression model, a training entity of the compression model, a provider of the compression model, or model parameters of the compression model.

Alternatively, or in addition, the identification of the compression model may be based on or related to a type of the terminal device 110. The type of the terminal device 110 may correspond to any suitable characteristic of the terminal device 110, for example but not limited to, a capability of the terminal device 110 (for example, capability associated with ML functionalities), a release version of the terminal device 110, a provider of the terminal device 110, etc.

In some example embodiments, in order to transmit the compressed CSI over the radio link between the terminal device 110 and the network device 120, the compressed CSI may be quantized into compressed bits. For example, the compressed CSI e(w) may be quantized by a quantization module (for example, a binarization module) into a vector of compressed binary elements c including b bit values. Then, the terminal device 110 may transmit the compressed bits and the identification of the compression model to the network device 120. It is to be noted that the identification may be also quantized into bits for transmission along with the compressed bits. For example, the identification of the terminal device 110 may be binarized into bits, which may be appended to the compressed bits for transmission.

At the network side, the network device 120 may receive (420), from the terminal device 110, the compressed CSI and the identification of the compression model used by the terminal device 110. For example, the network device 120 may receive the combined message including the compressed CSI and the identification of the compression model from the terminal device 110.

In some example embodiments, if the compressed bits and bits corresponding to the identification is received from the terminal device 110, the network device 120 may de-quantize the compressed bits into a set of values, which may be the latent vector q(w). For example, the dequantization module 230 may be used to the de-quantize the compressed bits to obtain the latent vector. Similarly, the bits corresponding to the identification may be de-quantized into the identification of the compression model.

Then, the network device 120 may determine an indicator corresponding to the compression model used by the terminal device 110 based on the identification. The indicator used here is the same as that for training the common decompression model. For example, a flag $f_i$ as described above may be determined. In some example embodiments, the indicator may be the same as the identification. Alternatively, in some example embodiments, a mapping between a plurality of indicators (for example, flags $f_1$ to $f_Q$) and a plurality of identifications may be used to determine the indicator to be used.

By using a common decompression model, the network device 120 may reconstruct the CSI for the channel between the terminal device 110 and the network device 120 based on the compressed CSI and the determined indicator. For example, the latent vector q(w) and the determined flag $f_i$ may be used as input to the common decompression model 310. The common decompression model 310 may generate the reconstructed CSI. In other words, the trained decoder may be used to obtain the estimate of the channel between the terminal device 110 and the network device 120.

Some example embodiments for the case of terminal device-first training are described above. For the terminal device-first training, each training entity for a terminal device may train an autoencoder with an encoder and a decoder independently on the channel samples w. Following type III training, the Q training entity at the terminal device side may share their channel and quantized encodings {(w, $q_1$(w)), (w, $q_2$(w)), . . . , (w, $q_Q$(w))} with the training entity at the network device side. The training entity at the network device side may need to train a mode(s) using the shared datasets to decode each of the quantized codes to reconstruct the channel. By signaling the identification of the compression model to the network device and also by considering the indicator for the compression model into CSI reconstruction, the CSI reconstruction performance may be ensured or even improved without the needs to train and maintain different decompression models.

Network Device-First Training Scheme

In some example embodiments, the network device-first training scheme may be employed. Each training entity for a decompression model may train an end-to-end model including the compression model, a quantization module, a dequantization module and a decompression model, such as the model 200 of FIG. 2. For example, each training entity may train an end-to-end autoencoder that includes an encoder, a quantizer, a de-quantizer and a decoder. As a result, a plurality of decompression models may be trained by different training entities at the network device side.

In the following, for purpose of discussion without any limitation, it is assumed that P decompression models may be trained by P training entities at the network side. After training the end-to-end model, at least a portion of a training dataset for training each of the P decompression models may be shared to a training entity for the compression model. Training samples $\{w_j, e_j(w)\}$ for training the j-th decompression model by the j-th training entity may be shared with the training entity for the compression model, where j=1, 2, . . . , P.

Figure 5A:
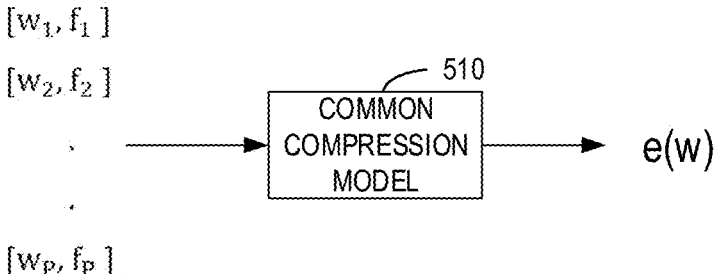
FIG. 5A illustrates an example for training of a compression model common for a plurality of decompression models according to some example embodiments of the present disclosure.

Then, the compression model common for the plurality of decompression models may be trained based on the training samples $\{w_j, e_j(w)\}$. Reference is now made to FIG. 5A to illustrate an example for training of a common compression model 510 for P decompression models according to some example embodiments of the present disclosure. In training of the common compression model 510, the CSI $w_j$ without compression of each training sample is used as an input to the common compression model 510 and the compressed CSI $e_j(w)$ may be used as the ground truth.

In addition, an indicator (for example, a flag) corresponding to each decompression model may be used as an additional input to the common compression model 510. In other words, the training samples $\{w_j, e_j(w)\}$ for the j-th decompression model may be used to train the common compression model 510 in combination with the indicator corresponding to the j-th compression model. For example, as shown in FIG. 5A, a flag $f_j$ for the compressed CSI $e_j(w)$ is input to the common compression model 510 along with the CSI $w_j$ without compression.

Figure 5B:
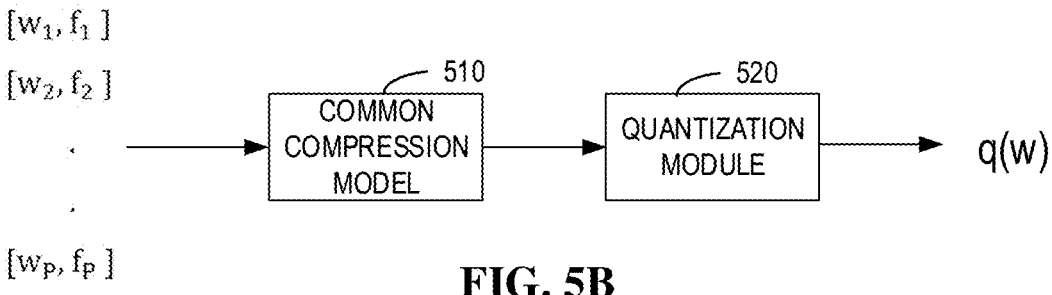
FIG. 5B illustrates another example for training of a compression model common for a plurality of decompression models according to some example embodiments of the present disclosure.

Alternatively, in some example embodiments, training samples $\{w_j, q_j(w)\}$ for training the j-th decompression model by the j-th training entity may be shared with the training entity for the compression model, where j=1, 2, . . . , P. In such example embodiments, as shown in FIG. 5B, the common compression model 510 is trained together with the quantization module 520. As shown, the CSI w; without compression and a flag $f_j$ of each training sample are used as an input to the common compression model 510 and then the quantization module. The compressed bits $q_j(w)$ may be used as the ground truth. It is to be understood that if the compressed bit $q_j(w)$ are used to train the common compression model, the quantization module is the same as that for training the decompression models.

In such example embodiments, the CSI, which may be the channel matrix w may have a size of the number of transmit antennas×the number of receive antennas×the number of frequency resources elements, e.g. (32×4×52). As the channel values have multiple dimensions, an indicator dimension to the input rather than using a single element may be added. The indicator dimension may be added to one of the dimensions based on the architecture of the model. For example, in the case of a Transformer-based encoder, the indicator may be added to the first dimension. In other words, the indicator number in the shape of 4×52 was added to the input.

Figure 6:
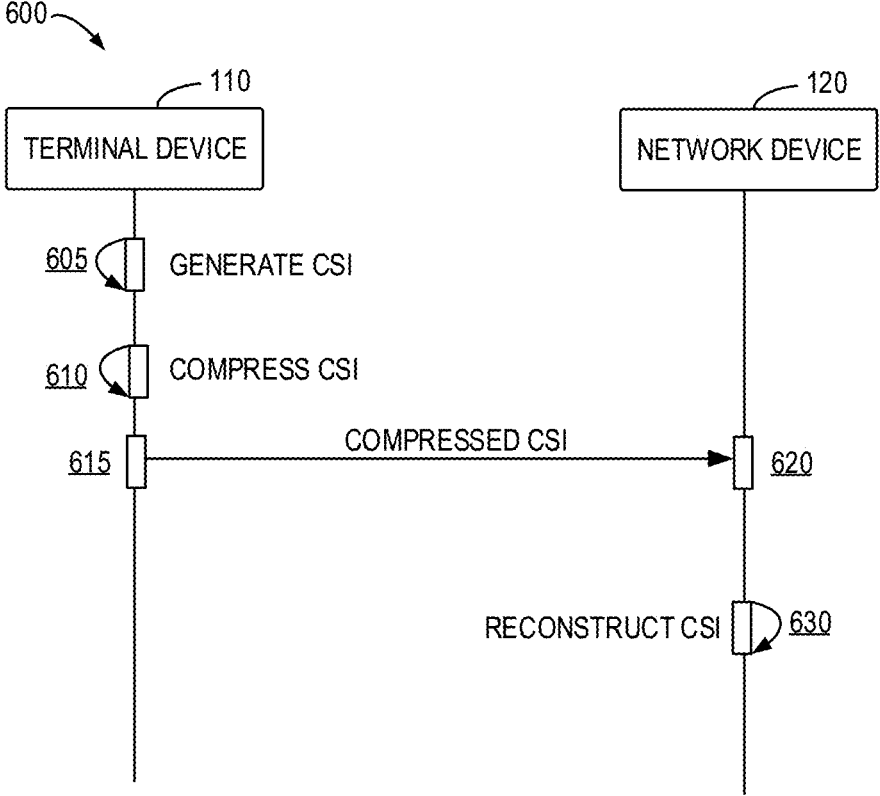
FIG. 6 illustrates an example signaling flow of reporting CSI in the case of first training at the network device side according to some example embodiments of the present disclosure.

After training, the P decompression models and the common compression model 510 may be used for real time operation. Reference is now made to FIG. 6 to illustrate an example signaling flow 600 of reporting CSI in the case of network device-first training according to some example embodiments of the present disclosure. The signaling flow 600 involves the terminal device 110 and the network device 120.

The terminal device 110 may generate (605) CSI for a channel between the terminal device 110 and the network device 120. In other words, channel estimation may be performed by the terminal device 110. For example, the terminal device 110 may estimate the channel based on reference signals from the network device 110 and construct the CSI w.

Then, by using a compression model, the terminal device 110 may generate (610) compressed CSI based on the CSI generated at 605 and an indicator corresponding to a decompression model for reconstructing the CSI. For example, the estimated CSI w and a flag f may be input to the compression model to generate the compressed CSI e(w).

In some example embodiments, the indicator corresponding to the decompression model at the network device 120 may be based on or related to a type of the decompression model. The type of the decompression model may correspond to any suitable characteristic of the decompression model, for example but not limited to, a machine learning algorithm employed by the decompression model, a neural network structure of the decompression model, a training dataset used for training the decompression model, a training entity of the decompression model, a provider of the decompression model, or model parameters of the decompression model.

Alternatively, or in addition, the indicator corresponding to the decompression model at the network device 120 may be based on or related to a type of the network device 120. The type of the network device 120 may correspond to any suitable characteristic of the network device 120, for example but not limited to, a capability of the network device 120 (for example, capability associated with ML functionalities), a provider of the network device 120, etc.

The indicator used here for a decompression model is the same as that for the decompression model in training. It is also to be noted that in such example embodiments, the terminal device 110 can be aware of which decompression model is to be used by the network device 120 in any suitable manner. Example embodiments are not limited in this regard.

The terminal device 110 may transmit (615) the compressed CSI to the network device 120. For example, a CSI report may be transmitted to the network device 120.

In some example embodiments, in order to transmit the compressed CSI over the radio link between the terminal device 110 and the network device 120, the compressed CSI may be quantized into compressed bits. For example, the compressed CSI e(w) may be quantized by a quantization module (for example, a binarization module) into a vector of compressed binary elements c including b bit values. Then, the terminal device 110 may transmit the compressed bits to the network device 120.

At the network side, the network device 120 may receive (620) the compressed CSI from the terminal device 110. For example, the network device 120 may receive the CSI report including the compressed CSI from the terminal device 110.

In some example embodiments, if the compressed bits are received from the terminal device 110, the network device 120 may de-quantize the compressed bits into a set of values, which may be the latent vector q(w). For example, the dequantization module 230 may be used to the de-quantize the compressed bits to obtain the latent vector.

Then, by using the decompression model, the network device 120 may reconstruct the CSI for the channel between the terminal device 110 and the network device 120 based on the compressed CSI. For example, the latent vector q(w) may be used as input to the decompression model deployed at the network device 120. The decompression model may generate the reconstructed CSI. In other words, the trained decoder may be used to obtain the estimate of the channel between the terminal device 110 and the network device 120.

Some example embodiments for the case of network device-first training are described above. For the network device-first training, each training entity for a network device may train an autoencoder with an encoder and a decoder independently on the channel samples w. Following type III training, the P training entity at the network device side may share their channel and encodings {(w, $e_1$(w)), (w, $e_2$(w)), . . . , (w, $e_P$(w))} with the training entity at the terminal device side. The training entity at the terminal device side may need to train a mode(s) using the shared datasets to encode the channel for each of the decompression model. By considering the indicator for the decompression model into CSI generation, the performance may be ensured or even improved without the needs to train and maintain different compression models.

It is to be noted that the above example embodiments are described with a single network device for the terminal device-first training and a single terminal device for the network device-first training. However, this is merely examples without any limitation. The proposed solution can be applied if the communication involves multiple network devices and multiple terminal devices.

Example Experiment Results

Figure 7:
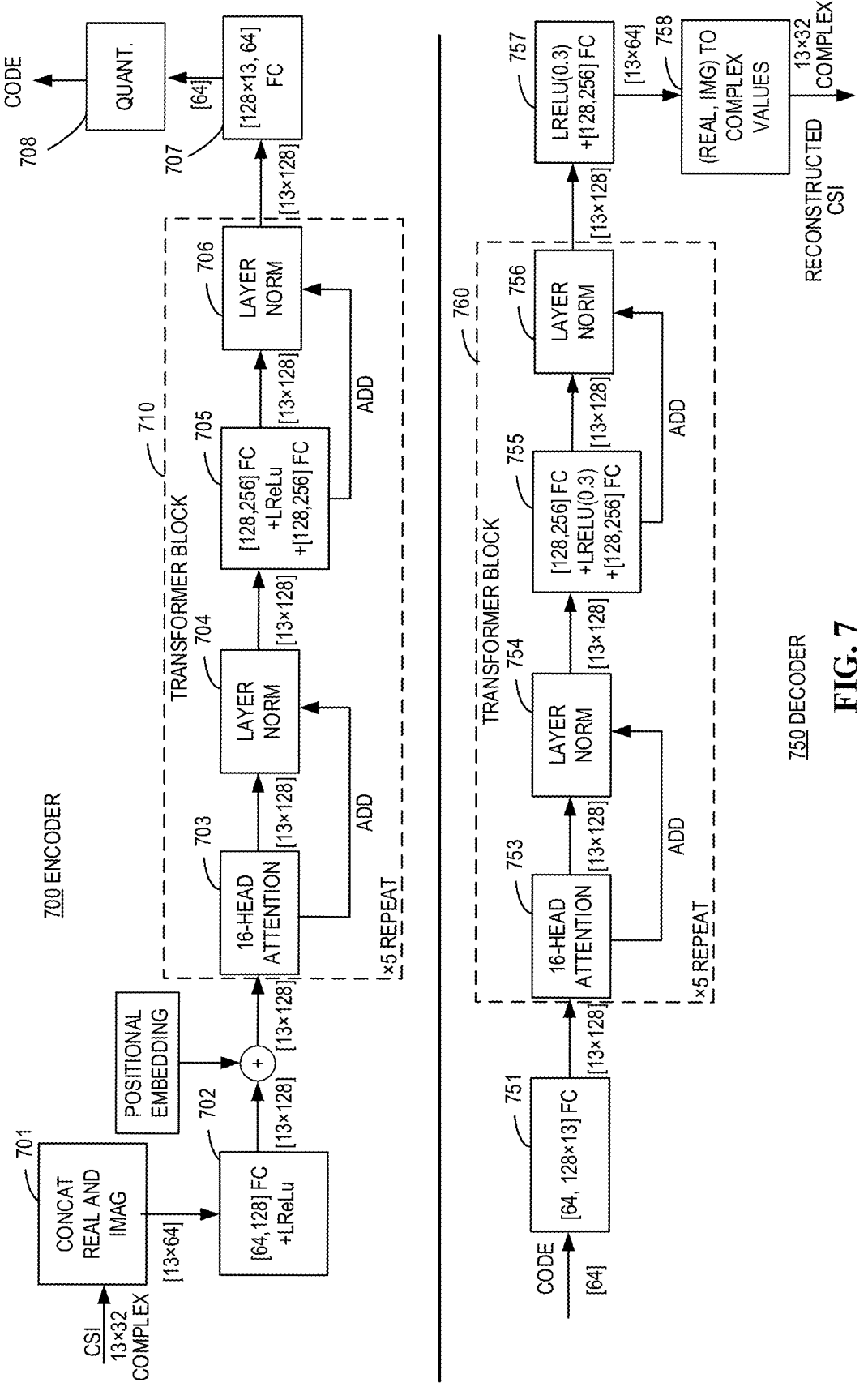
FIG. 7 illustrates an example Transformer architecture for CSI compression and decompression according to some example embodiments of the present disclosure.

FIG. 7 illustrates an example Transformer architecture (which may be also referred to as TF 1) for CSI compression and decompression according to some example embodiments of the present disclosure. As shown, in the encoder 700, real components and imagery components of the complex CSI values are concatenated at block 701. The block 702 includes a fully-connected (FC) layer with 64 input nodes and 128 output node, and a Leaky rectified linear unit (LReLU) layer. Before attention is applied, positional embedding is performed. The Transformer block 710 is repeated for 5 times. In the Transformer block 710, attention with 16 heads is applied at block 703. Then, at block 704, layer normalization is performed. The block 705 includes an FC layer with 128 input nodes and 256 output nodes, an LReLu layer and another FC layer with 128 input nodes and 256 output nodes. At block 706, layer normalization is performed. The block 702 include an FC layer with 128*13 input nodes and 64 output nodes, and then at block 708, quantization is performed.

In the decoder 750, the block 751 include an FC layer with 64 input nodes and 128*13 output nodes. Then, the Transformer block 760 may be repeated for 5 times. In the Transformer block 760, attention with 16 heads is applied at block 753. Then, at block 754, layer normalization is performed. The block 755 includes an FC layer with 128 input nodes and 256 output nodes, an LReLu layer and another FC layer with 128 input nodes and 256 output nodes. At block 756, layer normalization is performed. The block 757 include an LReLu layer and an FC layer with 128 input nodes and 256 output nodes, and then at block 758, complex values may be obtained.

Figure 8:
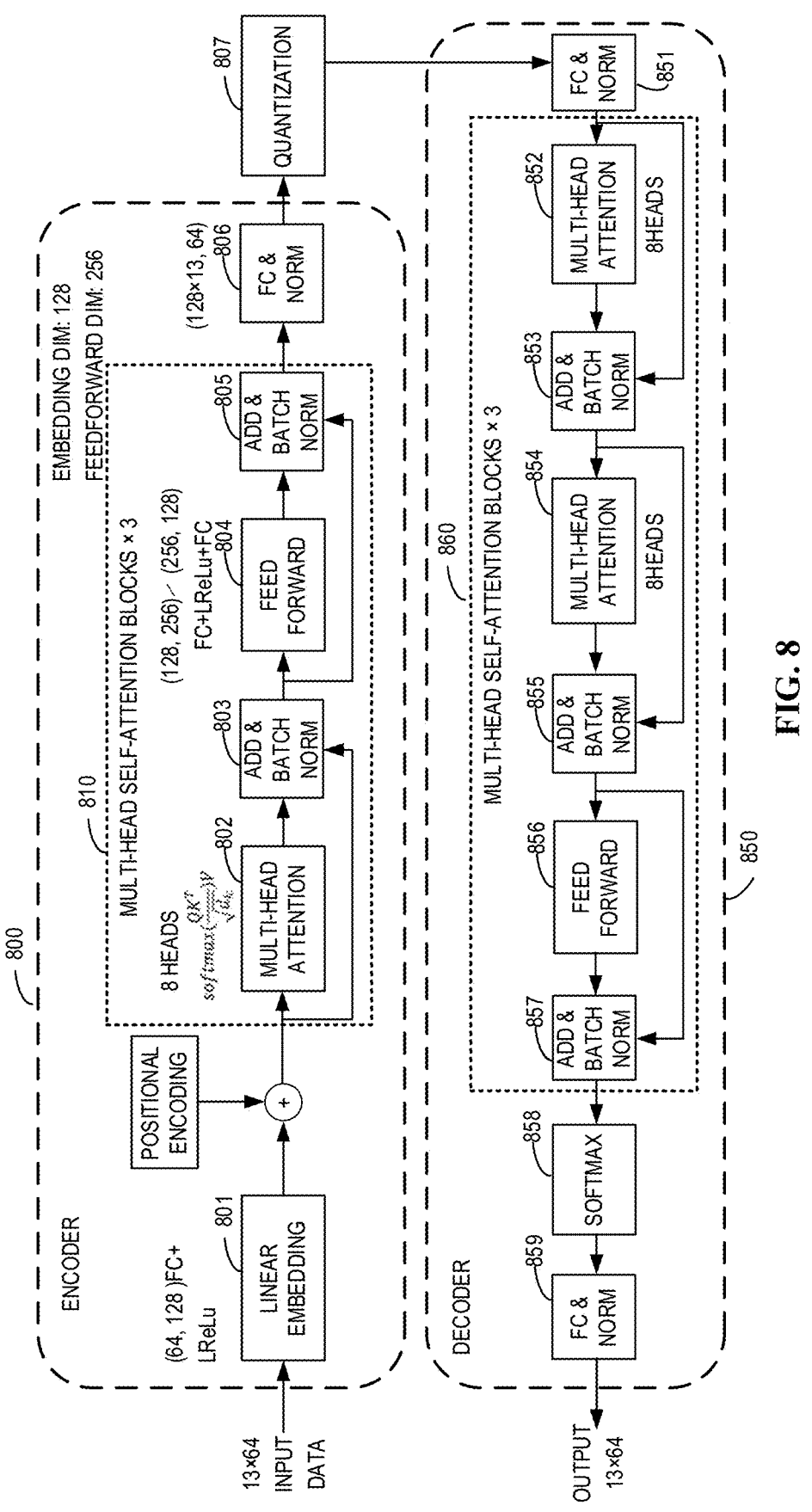
FIG. 8 illustrates another example Transformer architecture for CSI compression and decompression according to some example embodiments of the present disclosure.

FIG. 8 illustrates another example Transformer architecture (which may be also referred to as TF 2) for CSI compression and decompression according to some example embodiments of the present disclosure. In the encoder 800, linear embedding is performed at the block 801. The multi-head self-attention block 810 is repeated for 3 times. Specifically, at block 802, multi-head attention is applied. At block 803, adding and batch normalization are performed.

The block 804 performs feed forward including an FC layer, an LReLu layer and another FC layer. At block 805, adding and batch normalization are performed. The block 806 includes a FC layer and normalization layer. Quantization is performed at block 807.

Accordingly, in the decoder 850, the block 851 includes an FC layer and a normalization layer. Then, the multi-head self-attention block 860 is repeated for 3 times. In the block 860, attention with 8 heads is applied at block 852. At block 853, adding and batch normalization are performed. Attention with 8 heads is applied at block 854. At block 855, adding and batch normalization are performed. The block 856 performs feed forward. At block 857, adding and batch normalization are performed. At block 858, softmax is performed. The block 859 includes a FC layer and normalization layer to generate the output, which is the reconstructed CSI.

It is to be noted that structures of the models as shown in FIG. 7 and FIG. 8 are merely for purpose of illustration without any limitation. Moreover, the dimensions of data and operations are given as examples without any limitation.

Two independently trained transformer models representing UE were trained end-to-end on a 504k sample training set. A common decoder (5 transformation block with 16-head attention) representing the network device was trained from scratch using the code and channel values {($q_1$(w), w), ($q_2$(w), w)} assumed to be shared by each of the UEs. The training was repeated by adding a binary indicator to the latent vectors {($q_1$(w) 0, w), ($q_2$(w) 1, w)}. It is to be understood that the number of samples in the combined set may be kept as the number of samples in an individual training set to make the number of samples fixed in all experiments. In this case, the number of samples in the combined set was kept as 504k instead of 2*504, and there are 252k samples for ($q_1$(w) 0, w) and 252k samples for ($q_2$(w) 1, w).

As can be seen from Table 1, when the encoders from the UE side models ran with the common decoder, the squared cosine similarity only slightly decreased for both with indicator and without indicator experiments.

TABLE 1

| Squared Cosine Similarity results on the test set for 2 UE models | | | | | | |
| --- | --- | --- | --- | --- | --- | --- |
| | | | without indicator | | with indicator | |
| Overhead (bits) | TF-1 End-to-end | TF-2 End-to-end | TF-1 encoder with the common decoder | TF-2 encoder with the common decoder | TF-1 encoder with the common decoder | TF-2 encoder with the common decoder |
| 52 | 0.680 | 0.677 | 0.676 | 0.668 | 0.678 | 0.670 |
| 128 | 0.788 | 0.771 | 0.779 | 0.758 | 0.779 | 0.758 |
| 312 | 0.859 | 0.846 | 0.850 | 0.833 | 0.855 | 0.841 |

The experiment was repeated with the addition of a convolutional neural network (CNN)-based architecture. There are different ways to include categorical input to the rest of the inputs which are real valued. In the experiments, one-hot encoded elements {[1, 0, 0], [0, 1, 0], [0, 0, 1]} are added to the latent vector to use as input. As can be seen from Table 2, by adding more UE models, the performance of the common decoder without indicator gets worse.

TABLE 2

| | | | | without indicator | | | with indicator | | |
|---|---|---|---|---|---|---|---|---|---|
| Overhead (bits) | TF-1 End-to-end | TF-2 End-to-end | CNN End-to-end | TF-1 encoder with the common decoder | TF-2 encoder with the common decoder | CNN encoder with the common decoder | TF-1 encoder with the common decoder | TF-2 encoder with the common decoder | CNN encoder with the common decoder |
| 128 | 0.788 | 0.771 | 0.747 | 0.7382 | 0.7241 | 0.6976 | 0.761 | 0.748 | 0.733 |

The 2 independently trained transformer models are used to represent the networks this time. A common encoder (5 transformation block with 16-head attention) representing the UE model on combined two datasets $\{w, (q_1(w)), (w, q_2(w))\}$. W the channel of first eigenvectors had 52×32 complex values. As a preprocessing step, the real and imaginary values were formed into a (52×64) dimensional matrix. The training was repeated adding a binary indicator matrix on the second dimension (making the input 52×65). Similarly, it is to be understood that the number of samples in the combined set may be kept as the number of samples in an individual training set to make the number of samples fixed in all experiments.

TABLE 3

| | | | without indicator | | with indicator | |
|---|---|---|---|---|---|---|
| Overhead (bits) | TF-1 End-to-end | TF-2 End-to-end | TF-1 decoder with the common encoder | TF-2 decoder with the common encoder | TF-1 decoder with the common encoder | TF-2 decoder with the common encoder |
| 52 | 0.680 | 0.677 | 0.033 | 0.033 | 0.676 | 0.677 |
| 128 | 0.788 | 0.771 | 0.455 | 0.439 | 0.780 | 0.759 |
| 312 | 0.859 | 0.846 | 0.438 | 0.556 | 0.843 | 0.830 |

In Table 3, it is observed that a common encoder can't get a good performance on both decoders without the indicator. However, with the indicator the performance was close to the base performance.

Example Methods, Devices, Apparatuses

Figures 9, 10:
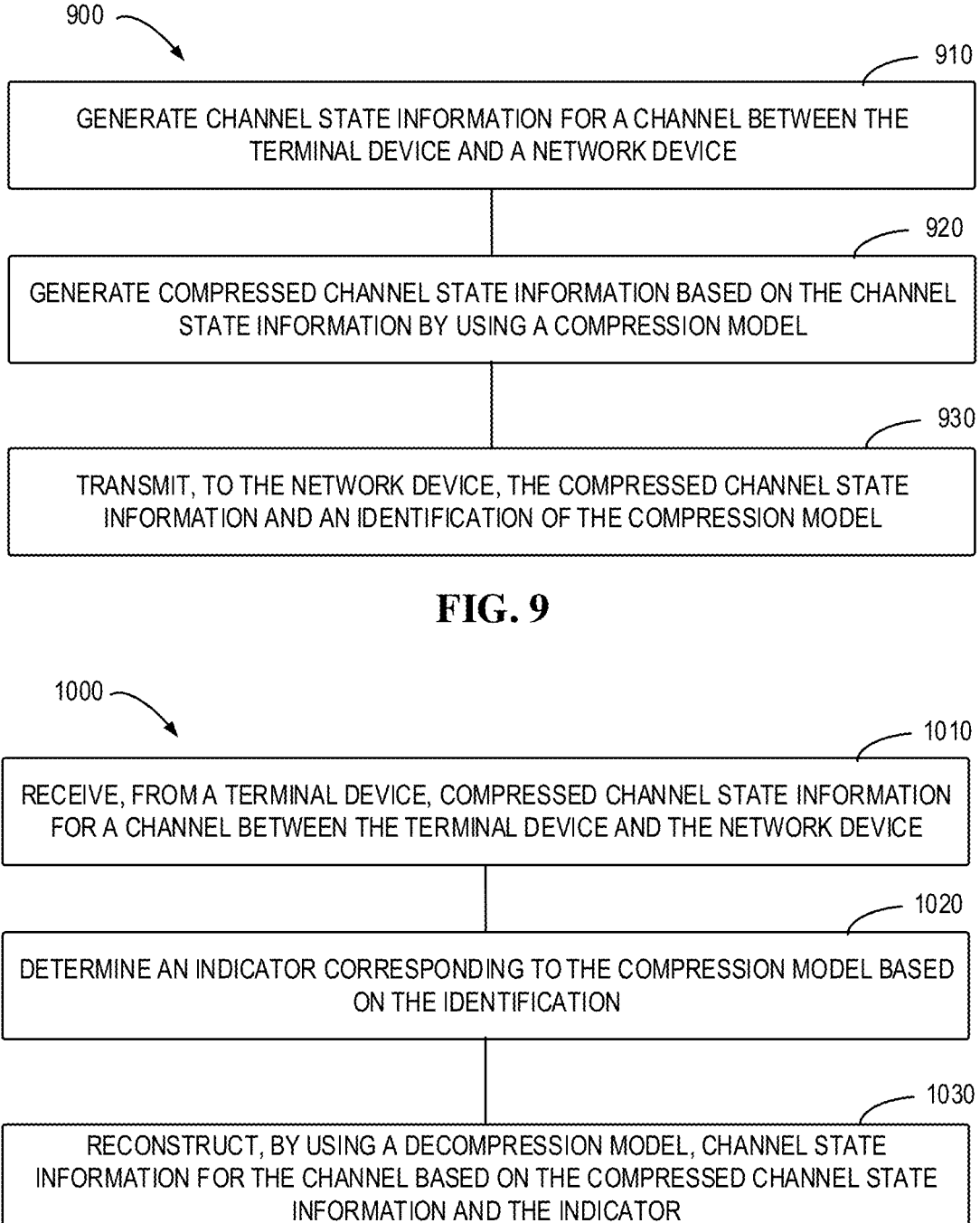
FIG. 9 illustrates a flowchart of a method implemented at a terminal device according to some example embodiments of the present disclosure.
FIG. 10 illustrates a flowchart of a method implemented at a network device according to some example embodiments of the present disclosure.

FIG. 9 shows a flowchart of an example method 900 implemented at a terminal device in accordance with some example embodiments of the present disclosure. For the purpose of discussion, the method 900 will be described from the perspective of the terminal device 110 in FIG. 1.

At block 910, the terminal device 110 generates channel state information for a channel between the terminal device 110 and a network device.

At block 920, the terminal device 110 generates compressed channel state information based on the channel state information by using a compression model; and At block 930, the terminal device 110 transmits, to the network device, the compressed channel state information and an identification of the compression model.

In some example embodiments, a decompression model for reconstructing the channel state information is common for a plurality of compression models comprising the compression model.

In some example embodiments, an end-to-end model comprising the compression model and a further decompression model is trained with a training dataset, and the decompression model is trained with a combination of: an indicator corresponding to the compression model, and at least a portion of the training dataset.

In some example embodiments, the method 900 further comprises: quantizing the compressed channel state information into compressed bits; and transmitting, to the network device, the compressed bits and the identification of the compression model.

In some example embodiments, the identification of the compression model is based on at least one of: a type of the compression model, or a type of the apparatus.

FIG. 10 shows a flowchart of an example method 1000 implemented at a network device in accordance with some example embodiments of the present disclosure. For the purpose of discussion, the method 1000 will be described from the perspective of the network device 120 in FIG. 1.

At block 1010, the network device 120 receives, from a terminal device, compressed channel state information for a channel between the terminal device and the network device 120, and an identification of a compression model for generating the compressed channel state information.

At block 1020, the network device 120 determines an indicator corresponding to the compression model based on the identification.

At block 1030, the network device 120 reconstructs, by using a decompression model, channel state information for the channel based on the compressed channel state information and the indicator.

In some example embodiments, the decompression model is common for a plurality of compression models comprising the compression model.

In some example embodiments, the decompression model is trained with a combination of: an indicator corresponding to each of the plurality of compression models, and at least a portion of a training dataset used to train the corresponding compression model.

In some example embodiments, the method 1000 further comprises: receiving, from the terminal device, compressed bits representing the compressed channel state information; de-quantize the compressed bits into a set of values; and reconstructing, by using the decompression model, the channel state information based on the set of values and the indicator.

In some example embodiments, the identification of the compression model is based on at least one of: a type of the compression model, or a type of the terminal device.

Figure 11:
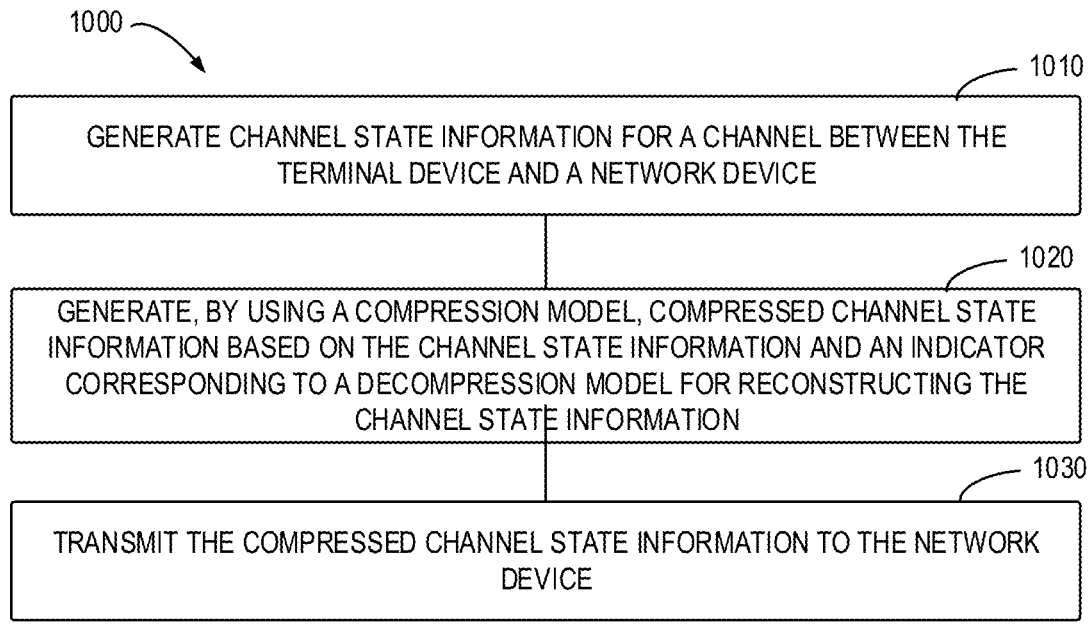
FIG. 11 illustrates a flowchart of a method implemented at a terminal device according to some example embodiments of the present disclosure.

FIG. 11 shows a flowchart of an example method 1100 implemented at a terminal device in accordance with some example embodiments of the present disclosure. For the purpose of discussion, the method 1100 will be described from the perspective of the terminal device 110 in FIG. 1.

At block 1110, the terminal device 110 generates channel state information for a channel between the apparatus and a network device.

At block 1120, the terminal device 110 generates, by using a compression model, compressed channel state information based on the channel state information and an indicator corresponding to a decompression model for reconstructing the channel state information.

At block 1130, the terminal device 110 transmits the compressed channel state information to the network device.

In some example embodiments, the compression model is common for a plurality of decompression models comprising the decompression model.

In some example embodiments, the compression model is trained by a combination of: an indicator corresponding to each of the plurality of decompression models, and at least a portion of a training data used to train the corresponding decompression model.

In some example embodiments, the method 1100 further comprises: quantizing the compressed channel state information into compressed bits; and transmitting the compressed bits to the network device.

In some example embodiments, the indicator corresponding to the decompression model is based on: a type of the decompression model, or a type of the network device.

Figure 12:
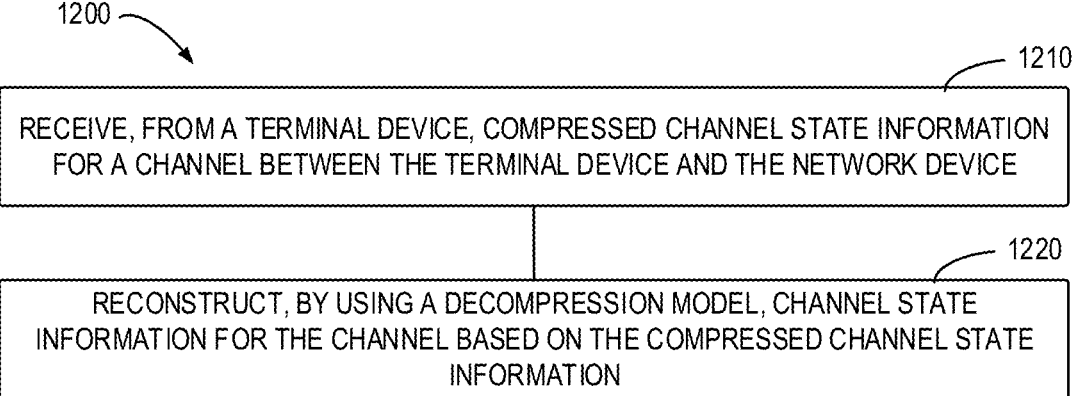
FIG. 12 illustrates a flowchart of a method implemented at a network device according to some example embodiments of the present disclosure.

FIG. 12 shows a flowchart of an example method 1200 implemented at a network device in accordance with some example embodiments of the present disclosure. For the purpose of discussion, the method 1200 will be described from the perspective of the network device 120 in FIG. 1.

At block 1210, the network device 120 receives, from a terminal device, compressed channel state information for a channel between the terminal device and the apparatus.

At block 1220, the network device 120 reconstructs, by using a decompression model, channel state information for the channel based on the compressed channel state information. The compressed channel state information is generated based on the channel state information and an indicator corresponding to the decompression model.

In some example embodiments, a compression model for generating the compressed channel state information is common for a plurality of decompression models comprising the decompression model.

In some example embodiments, an end-to-end model comprising the decompression model and a further compression model is trained with a training dataset, and the compression model is trained with a combination of: the indicator corresponding to the decompression model, and at least a portion of the training dataset.

In some example embodiments, the method 1200 further comprises: receiving, from the terminal device, compressed bits representing the compressed channel state information; de-quantize the compressed bits into a set of values; and reconstructing the channel state information based on the set of values by using the decompression model.

In some example embodiments, the indicator corresponding to the decompression model is based on: a type of the decompression model, or a type of the network device.

In some example embodiments, an apparatus capable of performing any of the method 900 (for example, the terminal device 110 in FIG. 1) may comprise means for performing the respective operations of the method 900. The means may be implemented in any suitable form. For example, the means may be implemented in a circuitry or software module. The apparatus may be implemented as or included in the terminal device 110 in FIG. 1.

In some example embodiments, the apparatus comprises means for generating channel state information for a channel between the apparatus and a network device; means for generating compressed channel state information based on the channel state information by using a compression model; and means for transmitting, to the network device, the compressed channel state information and an identification of the compression model.

In some example embodiments, a decompression model for reconstructing the channel state information is common for a plurality of compression models comprising the compression model.

In some example embodiments, an end-to-end model comprising the compression model and a further decompression model is trained with a training dataset, and the decompression model is trained with a combination of: an indicator corresponding to the compression model, and at least a portion of the training dataset.

In some example embodiments, the apparatus further comprises: means for quantizing the compressed channel state information into compressed bits; and means for transmitting, to the network device, the compressed bits and the identification of the compression model.

In some example embodiments, the identification of the compression model is based on at least one of: a type of the compression model, or a type of the apparatus.

In some example embodiments, the apparatus further comprises means for performing other operations in some example embodiments of the method 900 or the terminal device 110. In some example embodiments, the means comprises at least one processor; and at least one memory storing instructions that, when executed by the at least one processor, cause the performance of the apparatus.

In some example embodiments, an apparatus capable of performing any of the method 1000 (for example, the network device 120 in FIG. 1) may comprise means for performing the respective operations of the method 1000. The means may be implemented in any suitable form. For example, the means may be implemented in a circuitry or software module. The apparatus may be implemented as or included in the network device 120 in FIG. 1.

In some example embodiments, the apparatus comprises means for receiving, from a terminal device, compressed channel state information for a channel between the terminal device and the apparatus, and an identification of a compression model for generating the compressed channel state information; means for determining an indicator corresponding to the compression model based on the identification; and means for reconstructing, by using a decompression model, channel state information for the channel based on the compressed channel state information and the indicator.

In some example embodiments, the decompression model is common for a plurality of compression models comprising the compression model.

In some example embodiments, the decompression model is trained with a combination of: an indicator corresponding to each of the plurality of compression models, and at least a portion of a training dataset used to train the corresponding compression model.

In some example embodiments, the apparatus further comprises: means for receiving, from the terminal device, compressed bits representing the compressed channel state information; de-quantize the compressed bits into a set of values; and means for reconstructing, by using the decompression model, the channel state information based on the set of values and the indicator.

In some example embodiments, the identification of the compression model is based on at least one of: a type of the compression model, or a type of the terminal device.

In some example embodiments, the apparatus further comprises means for performing other operations in some example embodiments of the method 1000 or the network device 120. In some example embodiments, the means comprises at least one processor; and at least one memory storing instructions that, when executed by the at least one processor, cause the performance of the apparatus.

In some example embodiments, an apparatus capable of performing any of the method 1100 (for example, the terminal device 110 in FIG. 1) may comprise means for performing the respective operations of the method 1100. The means may be implemented in any suitable form. For example, the means may be implemented in a circuitry or software module. The apparatus may be implemented as or included in the terminal device 110 in FIG. 1.

In some example embodiments, the apparatus comprises means for generating channel state information for a channel between the apparatus and a network device; means for generating, by using a compression model, compressed channel state information based on the channel state information and an indicator corresponding to a decompression model for reconstructing the channel state information; and means for transmitting the compressed channel state information to the network device.

In some example embodiments, the compression model is common for a plurality of decompression models comprising the decompression model.

In some example embodiments, the compression model is trained by a combination of: an indicator corresponding to each of the plurality of decompression models, and at least a portion of a training data used to train the corresponding decompression model.

In some example embodiments, the apparatus further comprises: means for quantizing the compressed channel state information into compressed bits; and means for transmitting the compressed bits to the network device.

In some example embodiments, the indicator corresponding to the decompression model is based on: a type of the decompression model, or a type of the network device.

In some example embodiments, the apparatus further comprises means for performing other operations in some example embodiments of the method 1100 or the terminal device 110. In some example embodiments, the means comprises at least one processor; and at least one memory storing instructions that, when executed by the at least one processor, cause the performance of the apparatus.

In some example embodiments, an apparatus capable of performing any of the method 1200 (for example, the network device 120 in FIG. 1) may comprise means for performing the respective operations of the method 1200. The means may be implemented in any suitable form. For example, the means may be implemented in a circuitry or software module. The apparatus may be implemented as or included in the network device 120 in FIG. 1.

In some example embodiments, the apparatus comprises means for receiving, from a terminal device, compressed channel state information for a channel between the terminal device and the apparatus; and means for reconstructing, by using a decompression model, channel state information for the channel based on the compressed channel state information, and wherein the compressed channel state information is generated based on the channel state information and an indicator corresponding to the decompression model.

In some example embodiments, a compression model for generating the compressed channel state information is common for a plurality of decompression models comprising the decompression model.

In some example embodiments, an end-to-end model comprising the decompression model and a further compression model is trained with a training dataset, and the compression model is trained with a combination of: the indicator corresponding to the decompression model, and at least a portion of the training dataset.

In some example embodiments, the apparatus further comprises: means for receiving, from the terminal device, compressed bits representing the compressed channel state information; de-quantize the compressed bits into a set of values; and means for reconstructing the channel state information based on the set of values by using the decompression model.

In some example embodiments, the indicator corresponding to the decompression model is based on: a type of the decompression model, or a type of the network device.

In some example embodiments, the apparatus further comprises means for performing other operations in some example embodiments of the method 1200 or the network device 120. In some example embodiments, the means comprises at least one processor; and at least one memory storing instructions that, when executed by the at least one processor, cause the performance of the apparatus.

Figure 13:
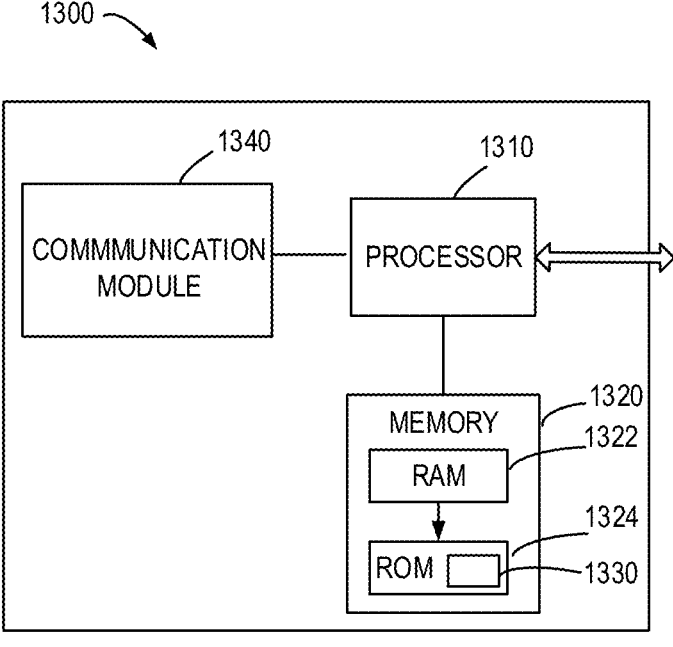
FIG. 13 illustrates a simplified block diagram of a device that is suitable for implementing example embodiments of the present disclosure.

FIG. 13 is a simplified block diagram of a device 1300 that is suitable for implementing example embodiments of the present disclosure. The device 1300 may be provided to implement a communication device, for example, the terminal device 110 or the network device 120 as shown in FIG. 1. As shown, the device 1300 includes one or more processors 1310, one or more memories 1320 coupled to the processor 1310, and one or more communication modules 1340 coupled to the processor 1310.

The communication module 1340 is for bidirectional communications. The communication module 1340 has one or more communication interfaces to facilitate communication with one or more other modules or devices. The communication interfaces may represent any interface that is necessary for communication with other network elements. In some example embodiments, the communication module 1340 may include at least one antenna.

The processor 1310 may be of any type suitable to the local technical network and may include one or more of the following: general purpose computers, special purpose computers, microprocessors, digital signal processors (DSPs) and processors based on multicore processor architecture, as non-limiting examples. The device 1300 may have multiple processors, such as an application specific integrated circuit chip that is slaved in time to a clock which synchronizes the main processor.

The memory 1320 may include one or more non-volatile memories and one or more volatile memories. Examples of the non-volatile memories include, but are not limited to, a Read Only Memory (ROM) 1324, an electrically programmable read only memory (EPROM), a flash memory, a hard disk, a compact disc (CD), a digital video disk (DVD), an optical disk, a laser disk, and other magnetic storage and/or optical storage. Examples of the volatile memories include, but are not limited to, a random access memory (RAM) 1322 and other volatile memories that will not last in the power-down duration.

A computer program 1330 includes computer executable instructions that are executed by the associated processor 1310. The instructions of the program 1330 may include instructions for performing operations/acts of some example embodiments of the present disclosure. The program 1330 may be stored in the memory, e.g., the ROM 1324. The processor 1310 may perform any suitable actions and processing by loading the program 1330 into the RAM 1322.

The example embodiments of the present disclosure may be implemented by means of the program 1330 so that the device 1300 may perform any process of the disclosure as discussed with reference to FIG. 9 to FIG. 12. The example embodiments of the present disclosure may also be implemented by hardware or by a combination of software and hardware.

In some example embodiments, the program 1330 may be tangibly contained in a computer readable medium which may be included in the device 1300 (such as in the memory 1320) or other storage devices that are accessible by the device 1300. The device 1300 may load the program 1330 from the computer readable medium to the RAM 1322 for execution. In some example embodiments, the computer readable medium may include any types of non-transitory storage medium, such as ROM, EPROM, a flash memory, a hard disk, CD, DVD, and the like. The term "non-transitory," as used herein, is a limitation of the medium itself (i.e., tangible, not a signal) as opposed to a limitation on data storage persistency (e.g., RAM vs. ROM).

Figure 14:
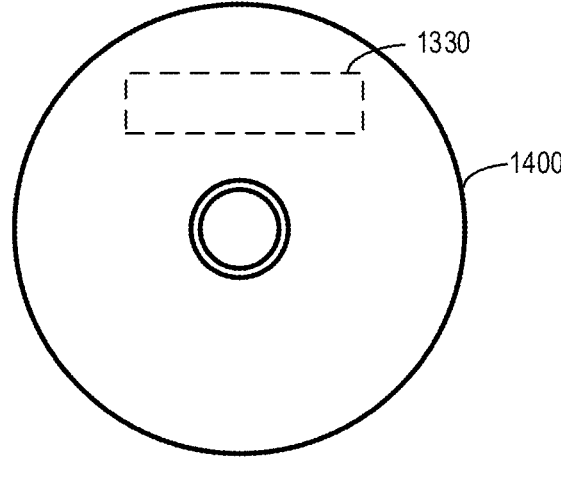
FIG. 14 illustrates a block diagram of an example computer readable medium in accordance with some example embodiments of the present disclosure.

FIG. 14 shows an example of the computer readable medium 1400 which may be in form of CD, DVD or other optical storage disk. The computer readable medium 1400 has the program 1330 stored thereon.

Generally, various embodiments of the present disclosure may be implemented in hardware or special purpose circuits, software, logic or any combination thereof. Some aspects may be implemented in hardware, and other aspects may be implemented in firmware or software which may be executed by a controller, microprocessor or other computing device. Although various aspects of embodiments of the present disclosure are illustrated and described as block diagrams, flowcharts, or using some other pictorial representations, it is to be understood that the block, apparatus, system, technique or method described herein may be implemented in, as non-limiting examples, hardware, software, firmware, special purpose circuits or logic, general purpose hardware or controller or other computing devices, or some combination thereof.

Some example embodiments of the present disclosure also provide at least one computer program product tangibly stored on a computer readable medium, such as a non-transitory computer readable medium. The computer program product includes computer-executable instructions, such as those included in program modules, being executed in a device on a target physical or virtual processor, to carry out any of the methods as described above. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. The program code may be provided to a processor or controller of a general purpose computer, special purpose computer, or other programmable data processing apparatus, such that the program code, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

In the context of the present disclosure, the computer program code or related data may be carried by any suitable carrier to enable the device, apparatus or processor to perform various processes and operations as described above. Examples of the carrier include a signal, computer readable medium, and the like.

The computer readable medium may be a computer readable signal medium or a computer readable storage medium. A computer readable medium may include but not limited to an electronic, magnetic, optical, electromagnetic, infrared, or semiconductor system, apparatus, or device, or any suitable combination of the foregoing. More specific examples of the computer readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, although operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, although several specific implementation details are contained in the above discussions, these should not be construed as limitations on the scope of the present disclosure, but rather as descriptions of features that may be specific to particular embodiments. Unless explicitly stated, certain features that are described in the context of separate embodiments may also be implemented in combination in a single embodiment. Conversely, unless explicitly stated, various features that are described in the context of a single embodiment may also be implemented in a plurality of embodiments separately or in any suitable sub-combination.

Although the present disclosure has been described in languages specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. An apparatus comprising:

at least one processor; and at least one memory storing instructions that, when executed by the at least one processor, cause the apparatus at least to:

generate channel state information for a channel between the apparatus and a network device;

generate compressed channel state information based on the channel state information by using a compression model; and transmit the compressed channel state information over a radio link to the network device by:

quantizing the compressed channel state information into a lower dimensional vector of compressed binary elements comprising bit values;

quantizing an identification of the compression model into bit values;

appending the quantized identification to the quantized compressed channel state information; and transmitting, to the network device, the quantized compressed channel state information and the quantized identification of the compression model.

2. The apparatus of claim 1, wherein a decompression model at the network device, for reconstructing the channel state information is common to a plurality of compression models comprising the compression model.

3. The apparatus of claim 2, wherein an end-to-end model comprising the compression model and a further decompression model is trained with a training dataset, and the decompression model is trained with a combination of:

an indicator corresponding to the compression model, and at least a portion of the training dataset.

4. The apparatus of claim 3, wherein the identification of the compression model is based on a type of the compression model and a type of the apparatus.

5. The apparatus of claim 4, wherein the compression model is a machine learning model.

6. The apparatus of claim 5, wherein the apparatus is a user equipment.

7. A system comprising:

a first apparatus comprising:

a first processor; and a first memory storing first instructions that, when executed by the first processor, cause the first apparatus at least to:

generate channel state information for a channel between the first apparatus and a network device;

generate compressed channel state information based on the channel state information by using a compression model; and transmit the compressed channel state information over a radio link to the network device by:

quantizing the compressed channel state information into a lower dimensional vector of compressed binary elements comprising bit values;

quantizing an identification of the compression model into bit values;

appending the quantized identification to the quantized compressed channel state information; and transmitting, to the network device, the quantized compressed channel state information and the quantized identification of the compression model; and a second apparatus comprising:

a second processor; and a second memory storing second instructions that, when executed by the second processor, cause the second apparatus at least to:

receive, from the first apparatus, the quantized compressed channel state information and the quantized identification of the compression model for generating the compressed channel state information;

determine an indicator corresponding to the compression model based on the identification; and reconstruct, by using a decompression model, channel state information for the channel based on the compressed channel state information and the indicator.

8. The system of claim 7, wherein the decompression model, for reconstructing the channel state information, is common to a plurality of compression models comprising the compression model.

9. The system of claim 8, wherein an end-to-end model comprising the compression model and a further decompression model is trained with a training dataset, and the decompression model is trained with a combination of:

the indicator corresponding to the compression model, and at least a portion of the training dataset.

10. The system of claim 8, wherein the identification of the compression model is based on a type of the compression model and a type of the first apparatus.

11. The system of claim 8, wherein the decompression model is trained with a combination of:

an indicator corresponding to each of the plurality of compression models, and at least a portion of a training dataset used to train the corresponding compression model.

12. The system of claim 11, wherein the second instructions, when executed by the second processor, further cause the second apparatus to:

de-quantize the bit values into a set of values; and reconstruct, by using the decompression model, the channel state information based on the set of values and the indicator.

13. A method comprising:

generating, at a user equipment, channel state information for a channel between the user equipment and a network device;

generating, at the user equipment, compressed channel state information based on the channel state information by using a compression model; and transmitting, at the user equipment, the compressed channel state information over a radio link to the network device by:

quantizing the compressed channel state information into a lower dimensional vector of compressed binary elements comprising bit values;

quantizing an identification of the compression model into bit values;

appending the quantized identification to the quantized compressed channel state information; and transmitting, to the network device, the quantized compressed channel state information and the quantized identification of the compression model;

receiving, by the network device from the user equipment, the quantized compressed channel state information and the quantized identification of the compression model for generating the compressed channel state information;

determining, by the network device, an indicator corresponding to the compression model based on the identification; and reconstructing, by the network device by using a decompression model, channel state information for the channel based on the compressed channel state information and the indicator.

14. The method of claim 13, wherein the decompression model at the network device, for reconstructing the channel state information, is common to a plurality of compression models comprising the compression model.

15. The method of claim 14, wherein an end-to-end model comprising the compression model and a further decompression model is trained with a training dataset, and the decompression model is trained with a combination of:

the indicator corresponding to the compression model, and at least a portion of the training dataset.

16. The method of claim 14, wherein the identification of the compression model is based on a type of the compression model and a type of the user equipment.

17. The method of claim 14, wherein the decompression model is trained with an indicator corresponding to each of the plurality of compression models.

18. The method of claim 17, wherein the decompression model is further trained with at least a portion of a training dataset used to train the corresponding compression model.

19. The method of claim 18, further comprising:

de-quantizing, by the network device, the bit values into a set of values; and reconstructing, by the network device using the decompression model, the channel state information based on the set of values and the indicator.

20. The method of claim 19, wherein an identification of the user equipment is binarized into bits, and wherein the method further comprises appending the binarized identification of the user equipment to the quantized compressed channel state information.

* * * * *